United States Patent [19]

Fukuda et al.

[11] Patent Number: 5,323,208
[45] Date of Patent: Jun. 21, 1994

[54] PROJECTION EXPOSURE APPARATUS

[75] Inventors: Hiroshi Fukuda, Kodaira; Tsutomu Tawa, Katsuta; Toshihide Dohi, Minoo, all of Japan

[73] Assignee: Hitachi, Ltd., Tokyo, Japan

[21] Appl. No.: 27,776

[22] Filed: Mar. 8, 1993

[30] Foreign Application Priority Data

Mar. 9, 1992 [JP] Japan .................................. 4-050421

[51] Int. Cl.⁵ .............................................. G03B 27/42
[52] U.S. Cl. ......................................... 355/53; 355/71
[58] Field of Search ..................................... 355/53, 71

[56] References Cited

U.S. PATENT DOCUMENTS

| 5,144,362 | 9/1992 | Kamon et al. | 355/53 |
| 5,251,067 | 10/1993 | Kamon | 355/53 |
| 5,253,040 | 10/1993 | Kamon et al. | 355/53 |
| 5,264,898 | 11/1993 | Kamon et al. | 355/53 |

FOREIGN PATENT DOCUMENTS 59-49514  3/1984  Japan.
61-91662  5/1986  Japan.

OTHER PUBLICATIONS

Japanese Society of Applied Physics and Related Societies, No. 2, 1991, p. 534.

Primary Examiner—Monroe H. Hayes
Attorney, Agent, or Firm—Fay, Sharpe, Beall, Fagan, Minnich & McKee

[57] ABSTRACT

In a reduction-type projection exposure apparatus provided by the present invention, a spatial filter having a predetermined complex amplitude-transmission distribution is fixed approximately at the pupil position of a projection lens thereof or at such a position that the spatial filter conjugates with the pupil. The complex amplitude transmittance of the spatial filter is controlled by a multiple-interference effect of the multi-layer coating forming the spatial filter or by the surface reflection occurring on the surface of the film which constitutes the spatial filter and has an index of refraction different from the air. The filter can thus be prevented from absorbing light, incurring neither thermal damage nor damage due to dissipated heat. As a result, the reduction-type projection exposure apparatus offers excellent resolution and an outstanding depth of focus.

11 Claims, 2 Drawing Sheets

PROJECTION EXPOSURE APPARATUS

BACKGROUND OF THE INVENTION

The present invention relates to a projection exposure apparatus. To describe it in more detail, the present invention relates to a projection exposure apparatus that can effectively prevent thermal damages and improve the depth of focus and the resolution.

In order to enhance the integration densities and increase operational speeds of a variety of solid-state devices such as LSI chips, miniaturization of circuit patterns is under way. At the present time, the reduction-type projection exposure apparatus, which has an excellent mass-productivity characteristic and displays superior resolution, is widely used in the creation of circuit patterns.

The resolution of the reduction-type projection exposure apparatus is proportional to the exposure wavelength but inversely proportional to the numerical apertures (NA). The depth of focus of the reduction-type projection exposure apparatus is, on the other hand, proportional to the exposure wavelength but inversely proportional to the square of the NA. Accordingly, increasing the NA and shortening the wavelength are effective techniques for improving the resolution. In the case of the conventional reduction-type projection exposure apparatus, these techniques have been used for achieving the enhanced resolution.

Increasing the NA and shortening the wavelength, however, inevitably make the depth of focus extremely short, giving rise to a problem described below.

As the integration density of an LSI chip becomes higher, dimensions of a variety of circuit patterns such as interconnections are getting miniaturized. The structure of a semiconductor device such as DRAM goes three-dimensional, introducing more and more steps and a higher and higher degree of unevenness on its surfaces. When projecting a mask pattern on the surface of a semiconductor substrate using a reduction-type projection exposure apparatus with a reduced depth of focus described above, therefore, some of the lower or upper portions of the steps or uneven profiles on the surface of the semiconductor substrate inevitably protrude out off the rang of the reduced depth of focus. As a result, it becomes difficult to create fine patterns over the entire surface of an LSI chip with a high degree of accuracy.

With the conventional techniques of increasing the NA and shortening the wavelength as described above, it is thus impossible to satisfy the needs for high resolution and a sufficient depth of focus simultaneously. As a result, some means for solving the problems are strongly demanded.

In order to achieve high resolution while, at the same time, retaining the required depth of focus, the present inventor discovered, at an early time, a so-called pupil filtering technique of installing a spatial filter, which has a special complex amplitude-transmission distribution at the pupil position of the projection lens, for improving the depth of focus and the resolution of the reduction-type projection exposure apparatus described above. Extended abstracts of this pupil filtering technique are explained on page 534 of the Japanese Society of Applied Physics and Related Societies, Issue No. 2 presented to the 38th Spring Meeting held in the year of 1991.

The outline of the pupil filtering technique is shown in FIG. 2. Reference numeral 1 shown in FIG. 2 denotes a reticle having a pattern to be created whereas reference numeral 2 is the projection lens of a reduction-type projection exposure apparatus. Reference numeral 3 is a spatial filter. The known reduction-type projection exposure apparatus prints the image of a predetermined pattern created on the reticle 1, onto a resist film on the substrate through the projection lens 2. Note that the resist film itself is not shown in the figure. The spatial filter 3 is fixed at a pupil position 4 or at an aperture step which determines the numerical aperture of the projection lens 1. The spatial filter 3 has a complex amplitude-transmission distribution expressed by Equation (1) as follows:

$$T(r) = \cos(2\pi \cdot \beta \cdot r^2 - \theta/2) \times circ(r) \tag{1}$$

where $\beta$ and $\theta$ are appropriate constants.

Equation (1) expresses the complex amplitude-transmission distribution as a function of radial-direction coordinate r. In this case, the radial-direction coordinate r is normalized by a maximum radius of the pupil or the aperture.

A resultant image can thereby be obtained by adding the amplitudes of two images A and B, to be created at two different positions $+\beta$ and $-\beta$ in the optical direction, with the amplitudes treated as vectors having a difference in phase corresponding to the constant $\theta$. As a result, a deep depth of focus and high resolution can be retained even if the NA is increased and, on top of that, the wavelength is shortened.

However, the pupil plane conjugates with a secondary illumination plane (effective source plane) of the reduction-type projection exposure apparatus. Accordingly, the illumination-intensity distribution of the secondary illumination source is redisplayed as it is. The secondary illumination source, which serves as the exit plane of an ordinary fly-eye lens, is a collection of point illumination sources having a sharp peak intensity focused by an effect of the fly-eye lens. Therefore, the light is also concentrated into spots on the lens pupil, resulting in a locally increased illumination intensity. An amplitude attenuating filter made of a photo-absorption material fixed on such a pupil plane dissipates heat because the amplitude attenuating filter absorbs light. Accordingly, the amplitude attenuating filter is thermally damaged, giving rise to a problem that the amplitude attenuating filter can no longer be used. In addition, the dissipated heat causes the substrate of the filter or the projection lens to partially expand. The expansion results in a distorted shape or, change in the index of refraction.

Accordingly, the optical characteristic of the reduction-type projection exposure apparatus deteriorates. As a result, there is the possibility of difficulty in creating a fine pattern with a high degree of accuracy.

It should be noted that patent application related to the present invention are those with an Ser. No. 07/622,606 filed on December 5, 1990, Ser. No. 07/765,060 filed on Sep. 24, 1991 and Ser. No. 07/846,158 filed on Mar. 5, 1992.

SUMMARY OF THE INVENTION

It is an object of the present invention to provide a reduction-type projection exposure apparatus, that takes advantage of the effect of the pupil filtering technique describe above without experiencing any undesirable effects caused by a thermal damage inflicted thereon by light or caused by light absorption, so as to solve the above problem.

In order to achieve the above objects, the reduction-type projection exposure apparatus provided by the present invention employs a filter which comprises a multi-layered coating made up of different materials. An example of such a multi-layered coating is a pile of silicon-oxide and aluminum-oxide films which are laid one upon another alternately.

In the reduction-type projection exposure apparatus provided by the present invention, a spatial filter having a predetermined complex amplitude-transmission distribution is fixed approximately at the pupil position of a projection lens thereof or at such a position that the spatial filter conjugates with the pupil. The amplitude transmittance of the spatial filter is controlled by amultiple-interference effect of the multi-layer coating forming the spatial filter or by the surface reflection occurring on the surface of te thin film which constitutes the spatial filter and has an index of refraction different from the air.

For an incident light beam hitting a multi-layer coating comprising a plurality of layers having idexes of refraction different from each other and virtually unnegligible light absorption, the index of refraction of each layer is determined by the multiple-interference effect whereas the transmittance and reflectance of each layer are determined by the thickness thereof. It should be noted that, the number of layers in the multi-layer coating is typically 2–4. By configuring a pupil filter using a multi-layer coating, the amplitude transmittance of the pupil filter can thus be controlled with no light absorbed into the multi-layer coating In this way, the pupil filter can therefore be essentially prevented from absorbing light, incurring no thermal damage due to dissipated heat.

In addition, when controlling the intensity of the transmitted light by means of the surface reflection occurring on the surface of the thin film forming the spatial filter with an index of reflection different from the air, the same effect can also be obtained as well. It should be noted that, in this case, the reflectance is determined by the index of refraction of the material of which the film is made. It is thus necessary to select an appropriate material in order to give a desired transmittance For example, silicon nitride can be used as a material having the desired transmittance. As an alternative, glass to which metallic oxide is added to give an adjusted index of refraction can also be used as well.

When controlling the transmittance by using these techniques, most or almost all of the light that does not pass through the spatial filter is reflacted. Accordingly, in order to prevent the so-called flare light originating from the reflacted light, it is desirable to apply an anti-reflaction coating to the surfaces of the projection lens and to the reticle, or to apply a light absorbing coating to the mask surface of the reticle.

It should be noted that the present invention is characterized in that a spatial filter comprising a multi-layer coating is fixed at a predetermined location on the projection lens. As for the other parts such as the condenser lens and the reticle holder, the same components as the ordinary reduction-type projection exposure apparatus can be used. However, these components do not have direct relation with the present invention. The elements that do not have direct relation with the present invention are thus not described in this specification in order to simplify the description and, thus, to make the description easy to understand.

DETAILED DESCRIPTION OF THE PREFERRED EMBODIMENTS

Example 1

Figure 1A:
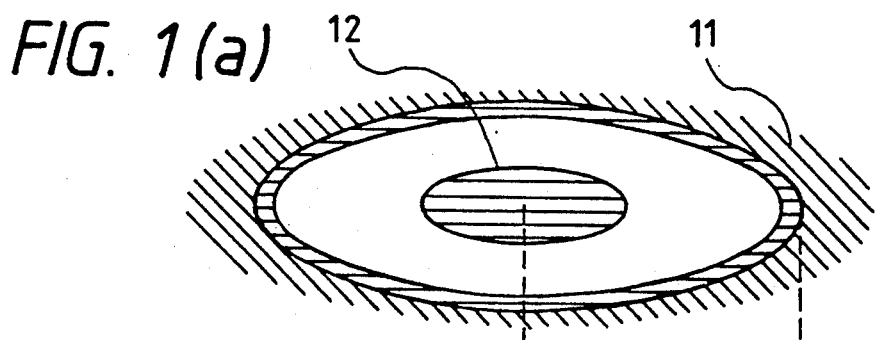
FIG. 1 is a set of diagrams for explaining an embodiment of the present invention, wherein FIG. 1 (a) is a perspective view of the top surface of a spatial filter employed in the embodiment, FIG. 1 (b) is a cross-sectional diagram of the spatial filter, FIG. 1 (c) is a diagram showing an amplitude-transmission distribution of the spatial filter.
Figure 1B:
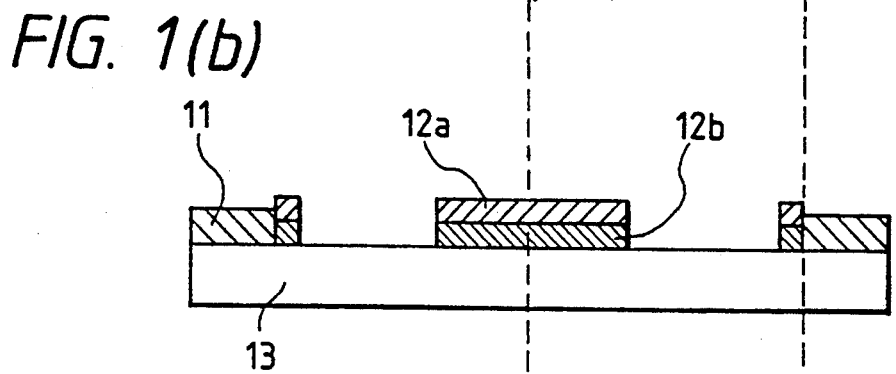
Figure 1C:
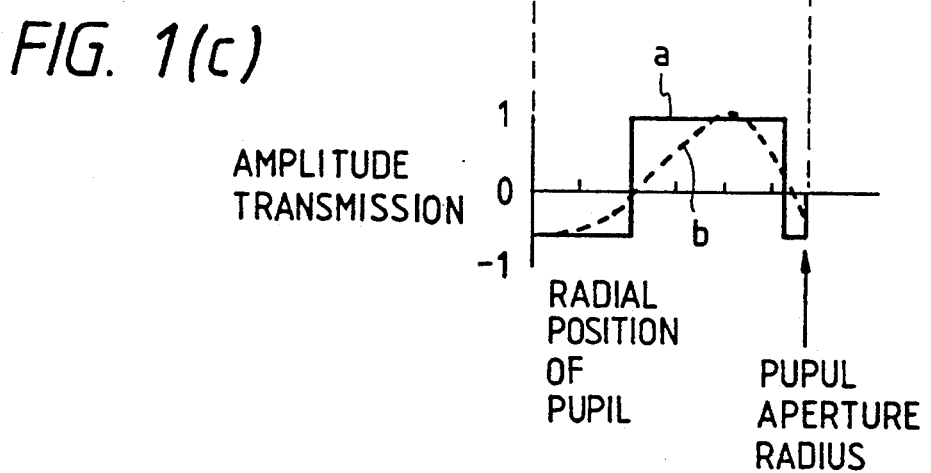

FIG. 1 is a set of diagrams used for explaining an embodiment implementing a spatial filter in accordance with the present invention. FIG. 1 (a) is a perspective view of the top surface of the spatial filter whereas FIG. 1 (b) is a cross-sectional diagram of the spatial filter. FIG. 1 (c) is a diagram showing an amplitude-transmission distribution of the spatial filter.

A circular light transmission region, which is also known as an aperture, is created at the center of a transparent substrate 13, also referred to as a quartz substrate, of the spatial filter. The transparent substrate 13 optically has sufficient thickness accuracy. At the center of the circular aperture and on the periphery thereof, a multi-layer coating 12a made up of an aluminum-oxide film and a silicon-oxide film is created. A phase shifter 12a made of a silicon-oxide film is further created on the multi-layer coating 12b with the former overlapping the latter A light shielding film 11 typically made of a chrome film is created outside the circular transparent substrate 13.

The aluminum-oxide and silicon-oxide films constitute a multi-layer coating 12b which has an optical transmittance of about 60%. The thickness of the phase shifter 12a is set at such a value that the difference in phase between the light passing through the phase shifter 12a and the multi-layer coating 12b and the light passing through the light transmission region with the above films not existing is 180 degrees. The difference in phase includes a phase shift caused by the passing of the light through the multi-layer coating 12b which is made up of silicon-oxide and aluminum-oxide.

An amplitude-transmission distribution in the radial direction is shown by a solid line a in FIG. 1 (c). A dotted line b shown in the same figure represents an amplitude-transmission distribution expressed by Equation (1) with $\beta$ set at 0.65 and $\theta$ set at 260 degrees. The distribution is an optimum distribution for the creation of a fine hole pattern. An amplitude-transmission distribution of the spatial filter provided by the present invention is obtained by discretized approximation of the distribution shown in FIG. 1 (c).

Figure 3:
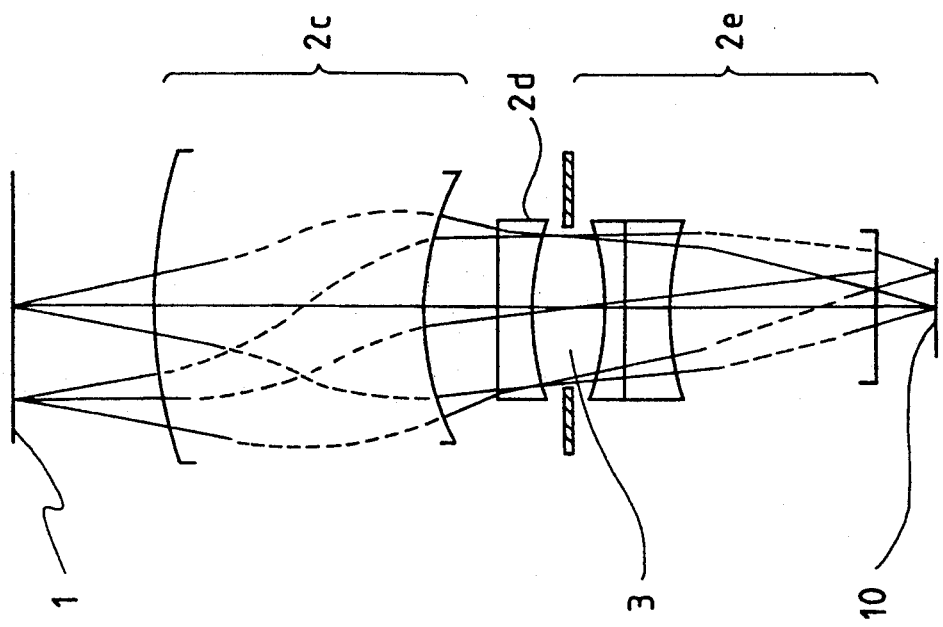
FIG. 3 is an explanatory diagram showing the positioning of the spatial filter.
Figure 2:
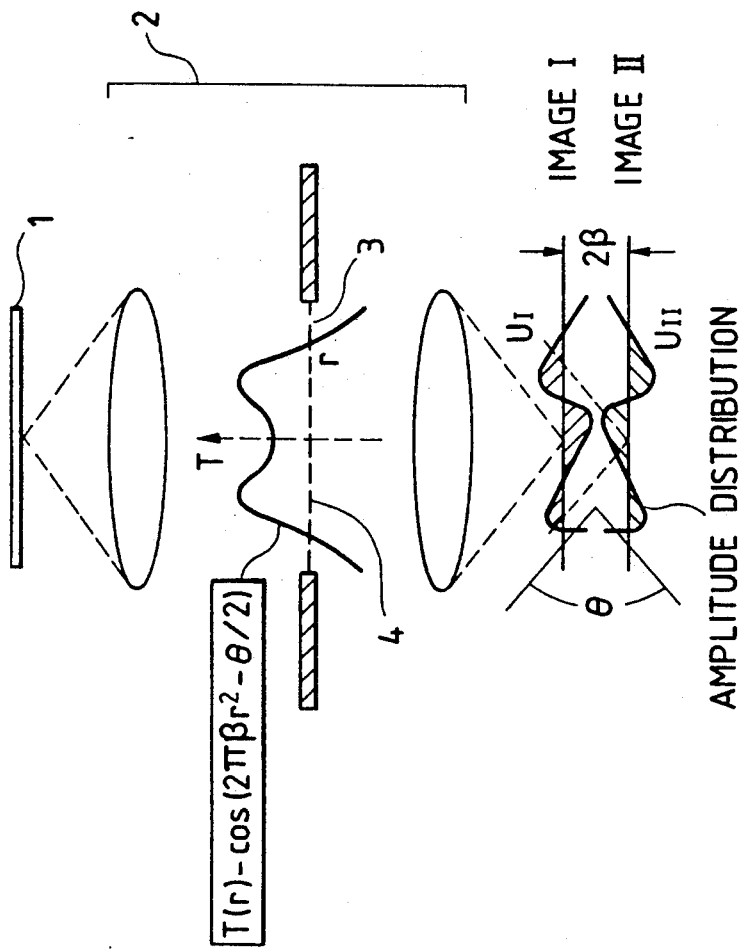
FIG. 2 is a typical and schematic diagram showing the pupil filtering technique.

As shown in FIG. 3, the spatial filter 3 described above was inserted into approximately the position of a pupil aperture of a projection lens employed in an i-line reduction-type projection exposure apparatus. A light beam coming from an illumination source not shown in the figure is irradiated to a reticle 1, undergoing an exposure operation to a resist film 10 with a mask pattern applied to a substrate thereof under a variety of focus conditions. The mask pattern included a hole pattern having a design dimension of 0.3 μm on the wafer substrate. The NA and the performance wavelength of each of projection lenses 2c, 2d and 2e employed in the reduction-type projection exposure apparatus were 0.5 and 365 nm for the i-line respectively.

Later on, a resist pattern created by a predetermined process of development was observed by means of a scanning electron microscope.

As a result, it was verified that a hole pattern having a diagonal of 0.25 μm was indeed created on the resist film with a depth of focus of ±2 μm. With the above filter not utilized, the resolution is 0.35 μm whereas the depth of focus is ±0.5 μm which are both inferior to the data resulting from the present invention.

That is to say, when creating a resist pattern by using the reduction-type projection exposure apparatus, a result much more excellent than that resulting from the conventional projection exposure apparatus is obtained. It has also been verified that a fine pattern with a dimension smaller than the wavelength of the light can be created with a depth of focus sufficient for practical applications.

In addition, the exposure operation cited above was repeated continuously until the exposure time reaches a total of 1000 hours. Then, the spatial filter was removed from the exposure apparatus only to find out by examination that the performance thereof did not deteriorate whatsoever. It was also verified that a thermal damage caused by light wa completely prevented.

It should be noted that the amplitude-transmission distribution shown in FIG. 1 (c) is selected by assuming an exposure operation of a fine hole pattern. It is desirable, however, to select one among a variety of amplitude-transmission distributions of the spatial filter depending upon the type of the master pattern. In addition, the phase shifter 12a can be placed below the multi-layer coating 12b instead of being fixed above it. As an alternative, the phase shifter 12a can also be provided on a region in the circular aperture which is not covered by the multi-layer coating 12b.

The magnitudes of the exposure wavelength and the NA of the reduction-type projection exposure apparatus are not necessarily limited to the values given above. In the embodiment described above, the silicon-oxide and aluminum-oxide films are used as materials for making up the multi-layer coating. These two types of films can further be used as layers overlapping each other alternately. It should be noted, however, that the materials for making up the multi-layer coating do not have to be the silicon-oxide and aluminum-oxide films. For example, a combination of films made of various kinds of materials corresponding to the wavelength of the light can also be used as well. An example of such materials is $NgF_2$, $ZnS$, $TiO$, $CeO_2$, $Si_2N_3$, etc. A dielectric multi-layer coating used for a band-pass filter is an easy-to-use one among them. It is desirable, however, to make the sum of the intensities of the transmitted and reflected rays of an incident light beam irradiated to any arbitrary point on the spatial filter equal to or greater than 90% of the intensity of the incident light beam itself. If the sum of the intensities of the transmitted and reflected rays is less than 90% of that of the incident light beam, the incident light absorbed by the filter is converted into heat, inflicting a thermal damage on the spatial filter. As a result, the index of refraction changes, having bad effects on the optical characteristic.

Example 2

A second embodiment implementing a reduction-type projection exposure apparatus in accordance with the present invention is shown in FIG. 3. In this embodiment, light originating from an annular illumination source is applied to a reticle 1. A secondary illumination-source plane constituting an effective illumination source with an annular configuration, and an annular aperture are described in documents such as Japanese Patent Laid-open No. 59-49514. Therefore, their drawings are omitted from this specification.

An annular region was so designed that its conjugating region on the pupil plane of the annular illumination region has an internal diameter equal to 50% of the pupil diameter and an external diameter equal to 70% of the pupil diameter. A pupil filter 3 was inserted into the pupil position of the projection lens so as to reduce the transmittance of the center portion thereof. The pupil filter 3 was created by evaporation of a dielectric multi-layer coating, with a transmittance of 40% and a reflectance of 60%, on an internal region within 70% of the pupil diameter at the center of the pupil aperture. It should be noted that the number of layers and the thickness of each layer of the multi-layer coating were determined such that there was no difference in phase between the light beams passing through regions on the pupil filter with a piece of the multi-layer coating created thereon and with no piece of the multi-layer coating created thereon.

Next, the reduction-type projection apparatus was used to create a resist pattern on a resist film 10 via the reticle 1 through an exposure process under some focus conditions and a development process. It should be noted that line-and-space patterns having some different dimensions had been created on the reticle 1.

As a result, a line-and-space pattern having a dimension of 0.3 μm could be created on the resist film 10 with a depth of focus of 2 μm.

If the above pupil filter is not used, on the other hand, the resolution is 0.35 μm whereas the depth of focus is 1.2 μm. The effect of the present invention can thereby be recognized. In addition, the exposure process was performed for 100 hours with no evidence of the deterioration of these performances.

The pupil filter employed in the embodiment is used for suppressing the transmittance for a low-order spatial frequency distribution. It should be noted, however, that the value of the transmittance of the pupil filter, the size of the region, on which the multi-layer coating are to be created, and the like are not limited to the examples given above. Instead, they can be adjusted appropriately. In spite of this flexibility, if the external diameter of the region for decreasing the transmittance is set to a value of the same order of the external diameter of the annular illumination conjugating region on the pupil plane, a particularly desirable effect is obtained. In addition, the multi-layer coating can also be made annular as well.

In the reduction-type projection exposure apparatus provided by the present invention, a spatial filter having a predetermined complex amplitude-transmission distribution is fixed approximately at the pupil position of a projection lens thereof or at such a position that the spatial filter conjugates with the pupil. The amplitude transmittance of the spatial filter is controlled by a multiple-interference effect of the multi-layer coating forming the spatial filter or by the surface reflection occurring on the surface of the thin film which constitutes the spatial filter and has an index of refraction different from the air. No thermal damage is thus inflicted on the spatial filter even if the spatial filter is fixed on the pupil plane on which the light is focused into a spot. As a result, a reduction-type projection exposure apparatus, which can stably retain a deep depth of focus and high resolution simultaneously, can be obtained. In addition, a fine resist pattern having a large depth of focus and high resolution can therefore be created by using the reduction-type projection exposure apparatus.

What is claimed is:

1. A reduction-type projection exposure apparatus comprising:
   an illumination source;
   an irradiator for applying a light beam generated by said illumination source to a reticle having a predetermined pattern;
   a projection lens for projecting said pattern onto a resist film; and
   a spatial filter comprising a multi-layer coating made up of a plurality of film layers overlapping each other, wherein:
   said spatial filter is fixed approximately at the position of a pupil of said projection lens or at such a position that said spatial filter conjugates with said pupil;
   said spatial filter has a predetermined complex amplitude-transmission distribution; and
   said film layers are made of materials different from each other.

2. A reduction-type projection exposure apparatus according to claim 1, wherein said spatial filter comprises a film having an index of refraction different from the index of refraction of the air.

3. A reduction-type projection exposure apparatus according to claim 2, wherein said film having an index of refraction different from the index of refraction of the air is a silicon-nitride film.

4. A reduction-type projection exposure apparatus according to claim 1, wherein said film layers comprise aluminum-oxide films and silicon-oxide films.

5. A reduction-type projection exposure apparatus according to claim 4, wherein said aluminum-oxide films and silicon-oxide films alternate with each other.

6. A reduction-type projection exposure apparatus according to claim 1, wherein said film layers are made of materials selected from a group of materials comprising $SiO_2$, $Al_2O_3$, $MgF_2$, $ZnS$, $TiO$, $CeO_2$, $Si_2N_3$ and $AlN$.

7. A reduction-type projection exposure apparatus according to claim 1, wherein a phase shifter is fixed on said multi-layer coating.

8. A reduction-type projection exposure apparatus according to claim 7, wherein said phase shifter is a silicon-nitride film.

9. A reduction-type projection exposure apparatus according to claim 1, wherein the sum of a transmitted-light intensity and a reflected-light intensity for an incident light beam irradiated to said spatial filter is equal to or greater than 90% of the intensity of said incident light beam.

10. A reduction-type projection exposure apparatus according to claim 1, wherein said complex amplitude-transmission distribution of said spatial filter is controlled to a predetermined value by multiple interference of said multi-layer coating.

11. A reduction-type projection exposure apparatus according to claim 1, wherein said complex amplitude-transmission distribution of said spatial filter is controlled to a predetermined value by surface reflection occurring on said multi-layer coating.

* * * * *